United States Patent
Steiner et al.

(10) Patent No.: US 6,432,814 B1
(45) Date of Patent: Aug. 13, 2002

(54) METHOD OF MANUFACTURING AN INTERCONNECT STRUCTURE HAVING A PASSIVATION LAYER FOR PREVENTING SUBSEQUENT PROCESSING REACTIONS

(75) Inventors: Kurt G. Steiner; Susan C. Vitkavage, both of Orlando, FL (US)

(73) Assignee: Agere Systems Guardian Corp., Orlando, FL (US)

(*) Notice: Subject to any disclaimer, the term of this patent is extended or adjusted under 35 U.S.C. 154(b) by 0 days.

(21) Appl. No.: 09/727,195

(22) Filed: Nov. 30, 2000

(51) Int. Cl.[7] .......................................... H01L 21/4763
(52) U.S. Cl. ....................... 438/624; 438/638; 438/780; 438/958
(58) Field of Search ................................. 438/623, 638, 438/780, 958, 624, 637, 622, 618

(56) References Cited

U.S. PATENT DOCUMENTS

| | | | |
|---|---|---|---|
| 5,924,005 A | * | 7/1999 | Waldo |
| 6,054,379 A | * | 4/2000 | Yau et al. |
| 6,140,226 A | * | 10/2000 | Grill et al. |
| 6,146,992 A | * | 11/2000 | Lauterbach et al. |
| 6,200,912 B1 | * | 3/2001 | Aoi |
| 6,258,732 B1 | * | 7/2001 | Lin et al. |
| 6,265,303 B1 | * | 7/2001 | Lu et al. |
| 6,319,815 B1 | * | 11/2001 | Iguchi et al. ............... 438/624 |
| 6,319,821 B1 | * | 11/2001 | Liu et al. ................... 438/636 |

FOREIGN PATENT DOCUMENTS

WO      WO 97/19462 A2  *  5/1997

OTHER PUBLICATIONS

"Lithographic Patterns with a Barrier Liner," IBM Technical Disclosure Bulletin, vol. 32, No. 10B, pp. 114–115, Mar. 1990.*

* cited by examiner

*Primary Examiner*—Keith Christianson
*Assistant Examiner*—Stephen W. Smoot

(57) ABSTRACT

The present invention provides a method of manufacturing an interconnect structure within a substrate. The method includes forming an opening in a substrate, which may be a dielectric layer having a low k; for example, one where the dielectric constant ranges from about 3.9 to about 1.9. This method further includes forming a passivation layer within the opening and a photoresist within the opening and over the passivation layer. The passivation layer substantially or completely inhibits the diffusion of elements from the substrate that can deactivate a photo acid generator (PAG) within the photoresist, which prevents the photoresist from developing properly.

20 Claims, 6 Drawing Sheets

300

400

900

1000

METHOD OF MANUFACTURING AN INTERCONNECT STRUCTURE HAVING A PASSIVATION LAYER FOR PREVENTING SUBSEQUENT PROCESSING REACTIONS

TECHNICAL FIELD OF THE INVENTION

The present invention is directed, in general, to a method of semiconductor fabrication and, more specifically, to a method of manufacturing an interconnect structure within a substrate employing a passivation layer to inhibit the diffusion of elements from the substrate.

BACKGROUND OF THE INVENTION

In the fabrication of advanced very large scale integration circuits (VLSI), Deep ultra-violet (DUV) lithography is widely used. Low dielectric constant (low k) inter-metal dielectrics are used in order to improve performance by reducing parasitic capacitance. Copper interconnects, which improve performance due to copper's low resistance, have also recently gained wide acceptance. These copper interconnects are typically formed using damascene or dual damascene processes to define the interconnect paths, and are typically used in conjunction with porous dielectric materials that have low dielectric constants (low k).

One approach of the damascene process is a full via first approach, which provides lower cost processing, improved level-level alignment tolerance and thus tighter design rules and improved performance. In the full via first approach, via holes are etched first, and then the trench is etched. The full via first is etched down to the copper or previous a layer of dielectric using the dual damascene process.

One problem associated with the full via first dual damascene approach is its integration with chemically amplified DUV photo resist (PR) systems. Because etch selectivity is needed when etching the via, nitrogen is added to the chemistry. However, the added nitrogen, in its radical form, diffuses into the porous, low k material. When trench lithography is performed, a DUV photoresist is put down into the via. The photoresist contains photo acid generators that are activated by DUV, thus forming photo acid catalysts. The photo acid catalysts, in turn, work to break the bonds of the photoresist, the photoresist then becomes soluble amino groups (weak base) that were previously lodged in the porous low k material freely leach out into the photoresist and interact with the photo acid catalyst (weak acid) and renders the photo acid catalyst inactive. This, in turn, prevents the photoresist from developing properly, which results in unwanted dome-like features, which cannot easily be removed.

Previous attempts to prevent the formation feature anomalies during trench lithography involves use of a DUV resists that are less sensitive to the basic amide groups of the low k material. Unfortunately, however, these alternate photo resist systems sacrifice feature size and resolution. This sacrifice in feature size and resolution is unacceptable because the success of semiconductor devices, especially those that pertain to computer and telecommunications applications, depends on both high speed operation and smaller device size, which require a high degree of resolution in the manufacturing process. Another attempt to prevent formation feature anomalies during trench lithography is to use a thick bottom anti-reflective coating (BARC) to passivate the service. Although a thicker BARC layer alleviates feature anomalies, it fails to eliminate the problem completely.

Accordingly, what is needed in the art is a method of manufacturing a semiconductor device that overcomes the deficiencies of the prior art.

SUMMARY OF THE INVENTION

To address the above-discussed deficiencies of the prior art, the present invention provides a method of manufacturing an interconnect structure within a substrate. In an advantageous embodiment, the method includes forming an opening in a substrate. In one aspect of this particular embodiment, the substrate may be a dielectric layer having a low dielectric constant; for example, one where the dielectric constant ranges from about 3.9 to about 1.9. This particular embodiment further includes forming a passivation layer within the opening and a photoresist within the opening and over the passivation layer. The passivation layer inhibits the diffusion of elements from the substrate that can deactivate a photo acid generator (PAG) within the photoresist, which inhibits the photoresist from developing properly. Due to the presence of the passivation layer, the photoresist is able to develop properly, which prevents the formation of photoresist anomalies, as found in prior art process. Thus, the presence of the passivation layer addresses the problems associated with the above-discussed prior art processes.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

The invention is best understood from the following detailed description when read with the accompanying FIGUREs. It is emphasized that in accordance with the standard practice in the semiconductor industry the various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
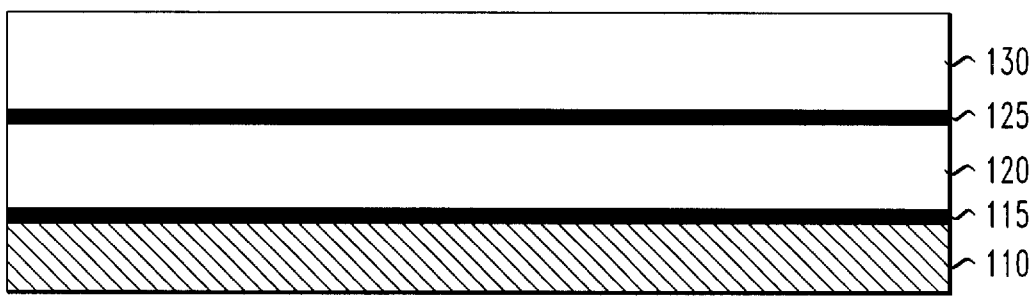
FIG. 1 illustrates a partial sectional view of an exemplary embodiment of an interconnect structure 100.

Referring to FIG. 1, illustrated is a partial sectional view of an exemplary embodiment of an intermediate structure 100 from which an interconnect structure as provided by the present invention may be formed. The intermediate structure 100 includes a metal layer 110 located on a surface of a semiconductor wafer substrate, an optional first etch stop layer 115, a first dielectric layer 120, a second etch stop layer 125, and second dielectric layer 130, all of which can be deposited with conventional deposition processes and materials. The metal layer 110 is first formed by conventionally depositing a conductive layer of metal, such as copper. While the first metal layer 110is shown as a continuous layer, it should be understood that this is for illustrative purposes only and that the metal layer 110 will typically be patterned into multiple separate features. The first dielectric layer 120 is conventionally formed over the first etch stop layer 115, if present, and the second etch stop layer 125 is conventionally formed over the first substrate layer 120. Silicon nitride or other similar etch stop materials may be used to form the first and second etch stop layers 115, 125. The second dielectric layer 130 is formed over the etch stop layer 125.

In an advantageous embodiment, the first and second dielectric layers 120 and 130 may be low k material. In such embodiments, the dielectric layers 120, 130 may have dielectric constants that range from about 3.8 to about 1.9. Some examples of low k materials include CVD formation of fluorinated oxide (FSG) having a dielectric constant of about 3.6, and spin on formation of hydrogen silsesquioxane (HSQ) having a dielectric constant of about 2.9. Further examples of low k materials include organic polymers like polyarylenes and polyarylene-ethers, which include SiLK™ (Dow Chemical-Midland, Mich.) and FLARE™ (AlliedSignal-Morristown, N.J.). Similarly, other low k materials having a dielectric constant of between about 2.6 and 2.8 and often referred to as organosilicate glasses (OSGs), which are carbon-doped silicon dioxide films, include the commercially available Black Diamond™ (Applied Materials-Santa Clara, Calif.), CORAL™ (Novellus-Phoenix, Ariz.) and Aurora™ (ASM-Phoenix, Ariz.). The first and second dielectric substrate layers 120, 130 may also be formed from other appropriate dielectric materials having the appropriate low-k. Alternatively, the second etch stop layer 125, located over the first substrate layer 120, may be formed from other available or future developed dielectric materials. Additionally, the metal layer 110 and the first and second etch stop layers 115, 125 are not limited to the materials disclosed above. For instance, the metal layer 110 may include other appropriate conductor metals used in integrated circuit design as other applications or embodiments may require.

The first and second substrate layers 120, 130 may typically be formed by methods that include but are not limited to chemical vapor deposition, physical vapor deposition, such as high density plasma deposition processes, or a conventional spin on technique, to a thickness ranging from about 300 nm to about 1000 nm. The etch stop layer 125 may typically have a thickness ranging from about 15 nm to about 100 nm, and it may be deposited by conventional plasma enhanced chemical vapor deposition or other similar process. One skilled in the art understands that the present invention may use varying thicknesses of the various layers depending on the design of the device.

Figure 2:
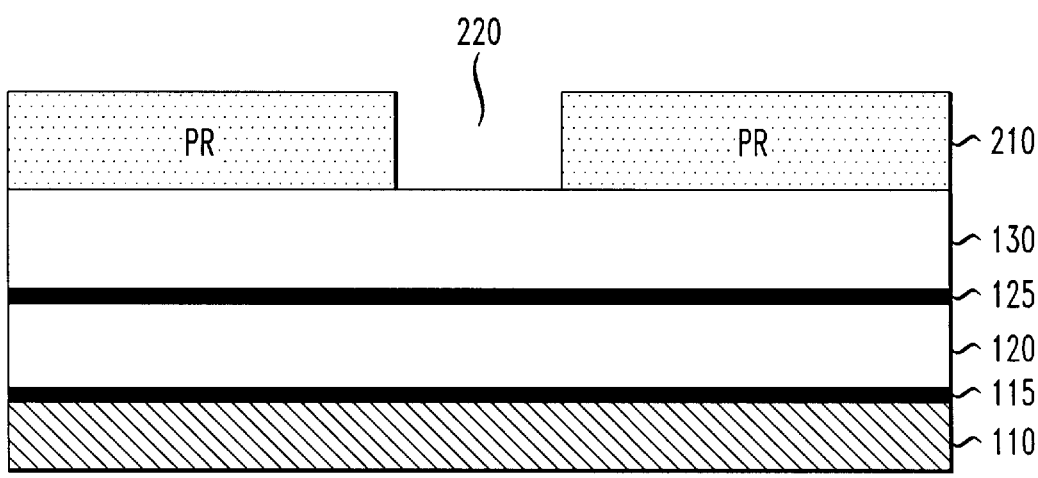
FIG. 2 illustrates a partial sectional view of an interconnect structure where the photoresist (PR) is deposited.

Turning now to FIG. 2, the photoresist 210 is deposited over the second substrate layer 130 with conventional deposition processes and materials. Typical photoresist used for trench lithography are aromatic substituted photoresist. Examples of such photoresists include hybrid-type photoresist, acetal, and S-CAP. Other photoresists include trade names such as Shipley UVG, Sumittomo 318, TOK 308 or PO. 65. The photoresist layer 210 is then conventionally patterned for via opening 220 as illustrated in FIG. 2.

Figure 3:
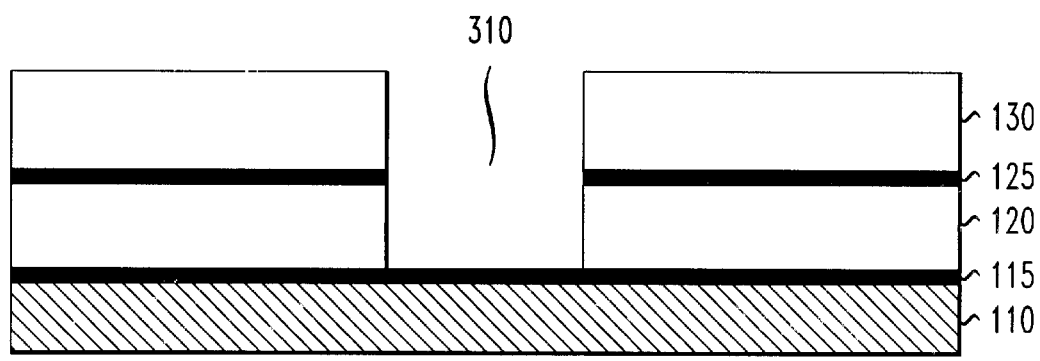
FIG. 3 illustrates a partial sectional view of an interconnect structure showing formation of via openings in the interconnect structure of FIG. 2.

Turning now to FIG. 3, illustrated is a partial sectional view of an interconnect structure 300 showing formation of a first full via opening 310 that extends to the metal layer 110 in the interconnect structure 200 of FIG. 2. The via opening 310 is formed as patterned by the photoresist 210 of FIG. 2, through the second substrate layer 130, the second etch stop layer 125 and the first substrate level 120. The first and second substrate layers 120, 130 are etched using conventional dielectric etching processes and the second etch stop layer 125 is also etched using conventional processes, such as by using a hesafluoride (SF6) etch.

Figure 4:
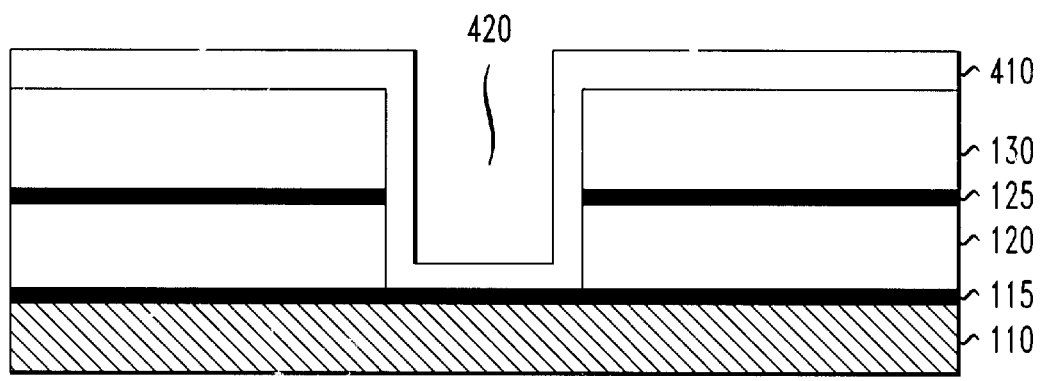
FIG. 4 illustrates a partial sectional view of an interconnect structure showing deposition of a passivation layer of the present invention, within the via opening and over the second substrate layer of FIG. 3.

Turning now to FIG. 4, illustrated is a partial sectional view of an interconnect structure 400 showing deposition of a passivation layer 410 within the first full via opening 310 of FIG. 3 and over the second substrate layer 130. The application of the passivation layer 410 may use a conventional spin on technique. While a conventional spin on technique may be used to deposit the passivation layer 410, other methods, such as chemical vapor deposition or physical vapor deposition, may be used. The thickness of the passivation layer 410 may range from about 5 nm to about 100 nm; however, the thickness of the passivation layer 410 may depend on the size of the first full via opening 310 and is, thus, not necessarily limited to this range.

The passivation layer 410 substantially inhibits the diffusion of elements, such as nitrogen, from the first and second substrate layers 120, 130 that may leach into the photoresist 510 and deactivate the photoresist's photo acid catalyst. Thus, the presence of the passivation layer 410 substantially inhibits or prevents the formation of the photoresist anomalies associated with the above-discussed prior art processes. In one advantageous embodiment, the passivation layer 410 includes an organic polymer. In another advantageous embodiment, this organic polymer includes a hydrophobic acrylate. In one particularly advantageous embodiment, this hydrophobic acrylate is a methyl methacrylate or a flouro-methacrylate. While advantageous embodiments employ methyl methacrylate and flouro-methacrylate, it should be recognized that other materials that are used for the passivation layer 410, which serve the same purpose of preventing diffusion of materials from the substrate layers and etch-stop layers into the photoresist, are still within the scope of the invention.

Figure 5:
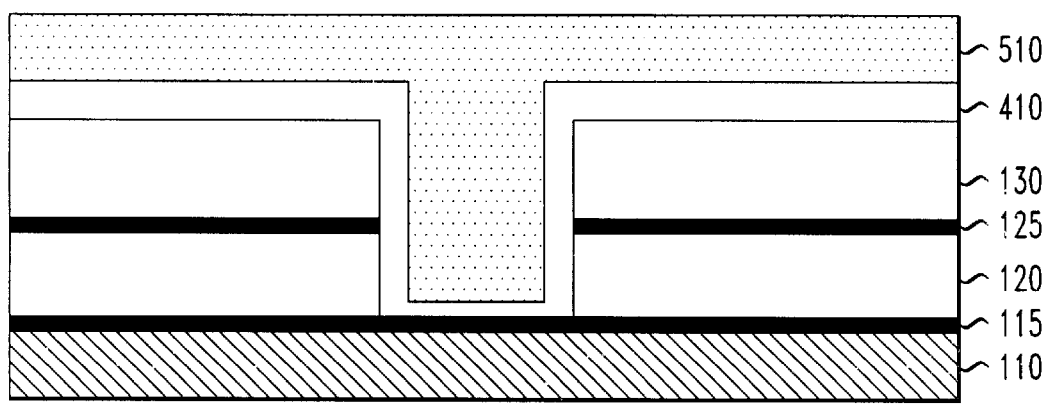
FIG. 5 illustrates a partial sectional view of an interconnect structure showing deposition and patterning of another photoresist layer to the interconnect structure of FIG. 4.

Turning now to FIG. 5, illustrated is a partial sectional view of an intermediate interconnect structure 500 showing deposition of photoresist layer 510 to the interconnect structure 400 of FIG. 4. The photoresist layer 510 is conventionally deposited within the via opening 420 of FIG. 4 and over the passivation layer 410. As previously mentioned, the low-k dielectric layers 120, 130 typically have nitrogen incorporated therein, which tends to diffuse into the photoresist 510 in the absence of the passivation layer 410. However, in the present invention, the nitrogen is substantially prevented from diffusing into the photoresist 510 due to the presence of the passivation layer 410. Thus, the nitrogen does not interfere with the proper development of the photoresist 510, which substantially or completely eliminates the photoresist anomalies often associated with prior art process that are discussed above.

Figure 6:
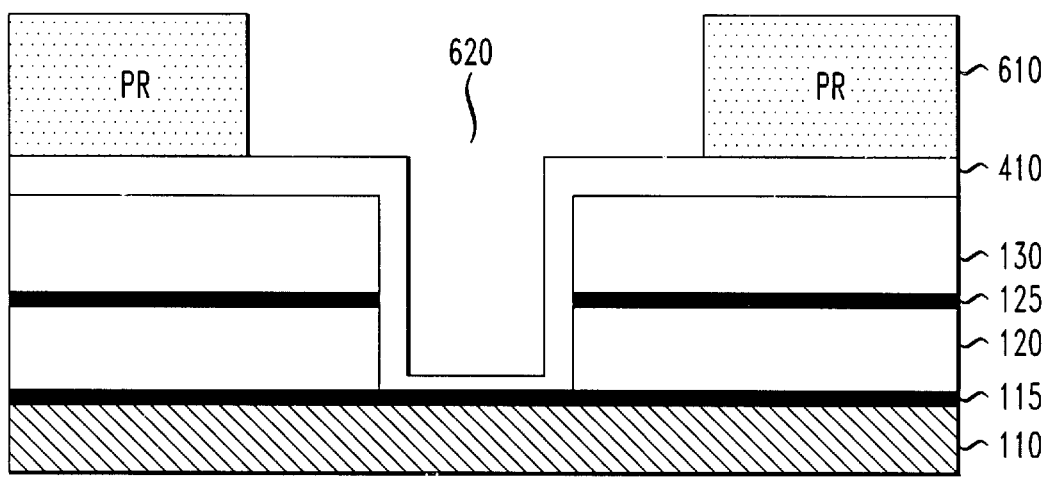
FIG. 6 illustrates a partial sectional view of an interconnect structure after the photoresist layer is patterned to embody the shape of a trench opening.

After, the photoresist layer 510 is deposited it is patterned to embody the shape illustrated in FIG. 6 for a trench opening. The via opening 620, in advantageous embodiments, may ultimately become an interconnect structure formed by a dual damascene process. The present invention is, therefore, particularly advantageous when conducted with damascene processes, however, it is not limited to such applications.

Figure 7:
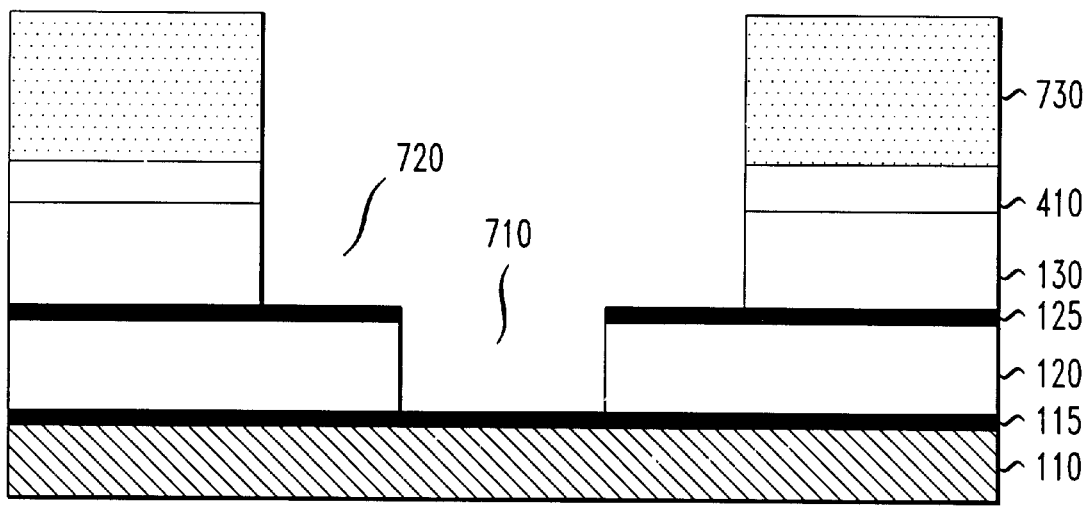
FIG. 7 illustrates a partial sectional view of an interconnect structure showing a dielectric etch that forms trench opening to interconnect structure of FIG. 6.

Turning now to FIG. 7, following the patterning of the photoresist layer 610 an etch is conducted that forms trench opening 720 over the via opening 710 that connects with conductive layer 110. The passivation layer 410 and the second substrate layer 130 are etched using any conventional dielectric etching processes, such as by using a hesafluoride (SF6) etch. The passivation layer 410 will etch in chemistry similar to that used to etch the dielectric layers 120, 130. Typically, etch chemistry such as $C_4F_8$ or $CF_4$ with $O_2$ or $CO_2$ and $N_2$ is used.

Figure 8:
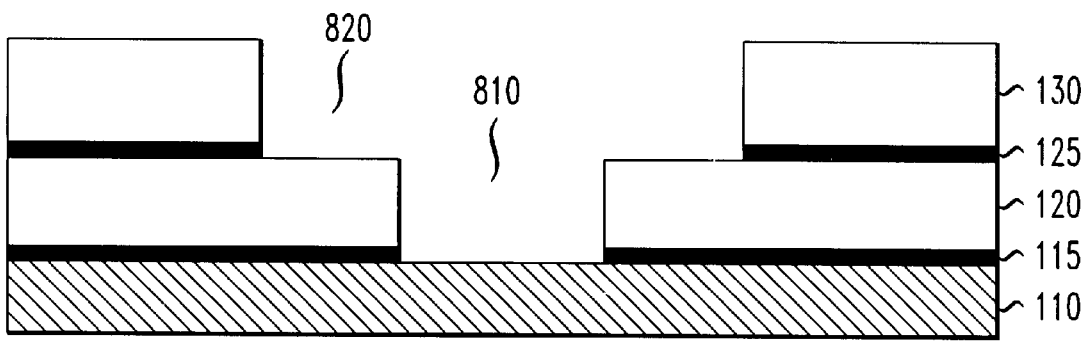
FIG. 8 illustrates a partial sectional view of an interconnect structure showing an etch of the first etch stop layer of the interconnect structure of FIG. 7.

Turning now to FIG. 8, illustrated is a partial sectional view of an interconnect structure 800 showing a conventional etch of the first etch stop layer 115 and second etch stop layer 125 of the interconnect structure 700 of FIG. 7. The trench opening may be etched through the second etch stop layer 125 to the first dielectric layer 120. Following the formation of the trench opening 820, the photoresist 730 of FIG. 7 and the remaining passivation layer 410 are conventionally removed, resulting in the interconnect structure 800 of FIG. 8. Furthermore, the trench opening 820 and the via opening 810 are cleaned, which results in interconnect structure 800.

Figure 9:
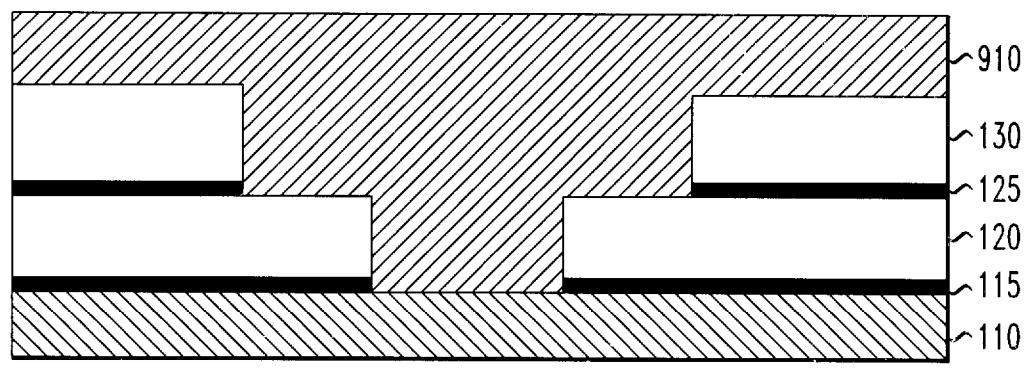
FIG. 9 illustrate a partial sectional view of an interconnect structure showing a conductive material deposited within the openings.

Turning now to FIG. 9, a conductive material 910, such as copper, may be deposited within the openings to form interconnect structure 900 of FIG. 9. Preferably, the conductive material is planarized back to the second substrate layer 130 to form the interconnect structure 1000 of FIG. 10. The planarization is achieved either by etch back or chemical mechanical polishing.

Figure 10:
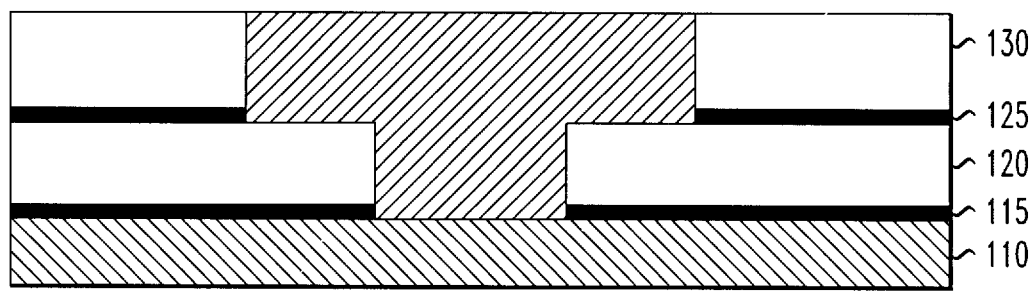
FIG. 10 illustrate a partial sectional view of an interconnect structure showing the conductive material planarized back to the second substrate layer.
Figure 11:
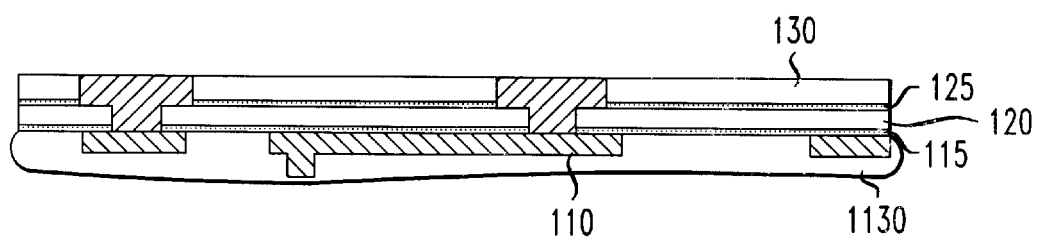
FIG. 11 illustrates a partial sectional view of a combined interconnect structure incorporating an embodiment of the interconnect structure as fabricated in FIGS. 1–10, and a conventionally formed integrated circuit (IC) that may be used in conjunction with the present invention.
Figure 11:
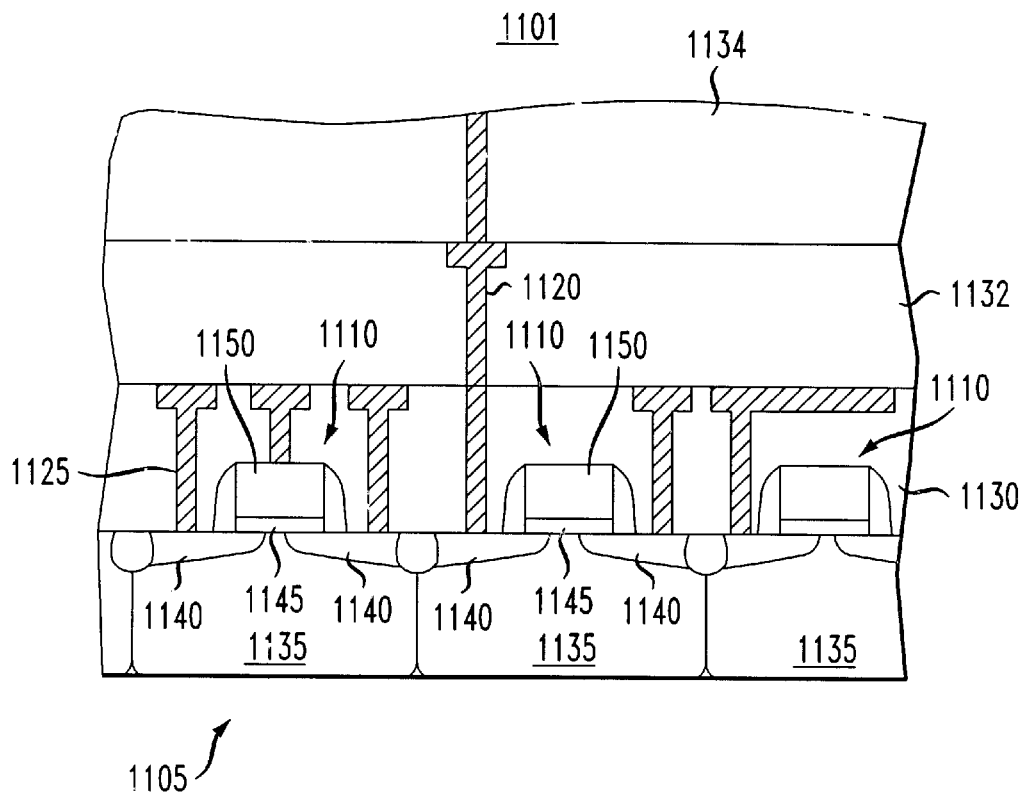

FIG. 11 illustrates a partial sectional view of a combined interconnect structure 1100 incorporating an embodiment of the interconnect structure 1000 as shown in FIG. 10 and discussed above, and a conventionally formed integrated circuit (IC) 1101 that may be used in conjunction with the present invention. While FIG. 11 does not specifically illustrate how the interconnect structure described in FIGS. 1–10 is electrically connected to the IC 1101, one who is skilled in the art understands how to make such a connection, and integrate the interconnect structure, as provided herein, into the IC 1101. The IC 1101 includes conventional transistors 1110 that are connected by a via 1120, as covered by the present invention or by more conventional interconnects 1125, such as damascene structures. The via 1120 shows an illustrative embodiment of the present invention. Dielectric layers 1130, 1132 and 1134 isolate the various layers of the IC 1100. As illustrated, the transistors 1110 are located on a semiconductor wafer substrate (generally designated 1105), and the via 1120, which is located within the dielectric layers 1130 1132, connect the transistors 1110 to different layers within the IC circuit 1100. Being of conventional design, forming the transistors 1110 may include forming semiconductor devices, such as a complementary metal oxide semiconductor device, a merged bipolar and complementary metal oxide semiconductor device, or a bipolar semiconductor device. In the illustrated embodiment, the transistors 1110 include conventionally formed tubs 1135, source/drains 1140, gate oxides 1145 and gates 1150. One who is skilled in the art knows how to fabricate the transistors 1110 interconnects or vias 1125 and dielectric layers 1130, 1132 and 1134. Furthermore, it is also understood that multiple transistors 1110, vias 1120 and dielectric layers 1130, 1132, and 1134, are typically interconnected to form the IC 1101.

Although the present invention has been described in detail, those skilled in the art should understand that they can make various changes, substitutions and alterations herein without departing from the spirit and scope of the invention in its broadest form.

What is claimed is:

1. A method of manufacturing an interconnect structure within a substrate, comprising:

forming a substrate and an etch stop layer within the substrate;

forming a first opening in the substrate;

forming a passivation layer within the first opening;

forming a photoresist within the first opening and over the passivation layer and the substrate;

patterning the photoresist to provide a guide opening over the first opening, the guide opening having a width greater than a width of the first opening; and forming a second opening in the substrate by removing the substrate and passivation layer as defined by the guide opening.

2. The method as recited in claim 1 wherein forming the substrate includes forming a substrate comprising a dielectric material having a low k constant.

3. The method as recited in claim 2 wherein forming the substrate comprising a dielectric material having a low k constant includes forming a dielectric material having a low k constant ranging from about 3.9 to about 1.9.

4. The method as recited in claim 1 wherein forming the passivation layer includes forming a passivation layer including an organic polymer.

5. The method as recited in claim 4 wherein forming the passivation layer including an organic polymer includes forming a passivation layer including a hydrophobic acrylate.

6. The method as recited in claim 5 wherein forming the passivation layer including the hydrophobic acrylate includes forming the passivation layer including a methyl methacrylate or a fluoro-methacrylate.

7. The method as recited in claim 1 wherein forming the passivation layer includes forming a passivation layer with a spin coating process.

8. The method as recited in claim 1 wherein the substrate has nitrogen incorporated therein and forming the photoresist within the opening and over the passivation layer and the substrate includes forming a photoresist comprising a photo acid generator catalyst, the photo acid generator being reactive with the nitrogen to form an inactive acid catalyst.

9. The method as recited in claim 1 wherein the opening is a first full via and the method further includes patterning the photoresist to form a trench structure over a portion of the first full via.

10. The method as recited in claim 9 further including forming a dual damascene structure subsequent to patterning the photoresist.

11. A method of manufacturing an integrated circuit, comprising:

forming transistors on a semiconductor substrate and an etch stop layer within the substrate;

forming dielectric layers over the transistors;

forming interconnect structures in the dielectric layers to interconnect the transistors to form an operative integrated circuit, forming the interconnect structures including:

forming a first opening in at least one of the dielectric layers;

forming a passivation layer within the first opening;

forming a photoresist within the first opening and over the passivation layer and the at least one of the dielectric layers;

patterning the photoresist to provide a guide opening over the first opening, the guide opening having a width greater than a width of the first opening; and forming a second opening in the substrate by removing the substrate and passivation layer as defined by the guide opening.

12. The method as recited in claim 11 wherein forming the dielectric layers includes forming at least one dielectric layer comprising a dielectric material having a low k constant.

13. The method as recited in claim 12 wherein forming the at least one dielectric layer having a low k constant includes forming at least one dielectric layer having a low k constant ranging from about 3.9 to about 1.9.

14. The method as recited in claim 11 wherein forming the passivation layer includes forming a passivation layer including an organic polymer.

15. The method as recited in claim 14 wherein forming the passivation layer including an organic polymer includes forming a passivation layer including a hydrophobic acrylate.

16. The method as recited in claim 15 wherein forming the passivation layer including the hydrophobic acrylate includes forming the passivation layer including a methyl methacrylate or a fluoro-methacrylate.

17. The method as recited in claim 11 wherein forming the passivation layer includes forming a passivation layer with a spin coating process.

18. The method as recited in claim 11 wherein at least one of the dielectric layers has nitrogen incorporated therein and forming the photoresist within the opening and over the passivation layer and the at least one of the dielectric layers includes forming a photoresist comprising a photo acid generator catalyst, the photo acid generator being reactive with the nitrogen to form an inactive acid catalyst.

19. The method as recited in claim 11 wherein the opening is a first full via and the method further includes patterning the photoresist to form a trench structure over a portion of the first full via.

20. The method as recited in claim 19 further including forming a dual damascene structure subsequent to patterning the photoresist.

* * * * *